(12) United States Patent
Kim et al.

(10) Patent No.: US 8,782,490 B2
(45) Date of Patent: Jul. 15, 2014

(54) DATA STORAGE DEVICE AND PROGRAM METHOD THAT MODIFIES ARRANGEMENT OF PROGRAM DATA TO ELIMINATE INTERFERING DATA PATTERNS

(75) Inventors: Yong June Kim, Seoul (KR); Kyoung Lae Cho, Yongin-si (KR); Hong Rak Son, Anyang-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 344 days.

(21) Appl. No.: 13/103,460

(22) Filed: May 9, 2011

(65) Prior Publication Data
US 2011/0276857 A1 Nov. 10, 2011

(30) Foreign Application Priority Data
May 10, 2010 (KR) .................. 10-2010-0043613

(51) Int. Cl.
*G11C 29/00* (2006.01)
*G06F 11/10* (2006.01)
*G11C 29/10* (2006.01)
*G11C 29/04* (2006.01)
*H03M 7/46* (2006.01)

(52) U.S. Cl.
CPC ............ *G06F 11/1048* (2013.01); *G11C 29/10* (2013.01); *G11C 2029/0411* (2013.01); *H03M 7/46* (2013.01)
USPC .......................................... 714/763; 714/758

(58) Field of Classification Search
CPC ................ G06F 11/1048; G11C 29/10; G11C 2029/0411; H03M 7/46
USPC .................................. 714/701, 704, 758, 763
See application file for complete search history.

(56) References Cited

U.S. PATENT DOCUMENTS

| | | | | |
|---|---|---|---|---|
| 4,993,029 | A * | 2/1991 | Galbraith et al. | 714/769 |
| 6,289,481 | B1 | 9/2001 | Egawa | |
| 8,156,400 | B1 * | 4/2012 | Yeo et al. | 714/758 |
| 8,219,886 | B1 * | 7/2012 | Sutardja et al. | 714/768 |
| 8,248,848 | B1 * | 8/2012 | Tang et al. | 365/185.03 |

(Continued)

FOREIGN PATENT DOCUMENTS

| | | |
|---|---|---|
| JP | 2003-223765 | 8/2003 |
| JP | 2008-004195 | 1/2008 |
| KR | 1020080084230 A | 9/2008 |
| KR | 1020100010664 A | 2/2010 |

OTHER PUBLICATIONS

Vasic, B.; Pedagani, K., "Run-length-limited low-density Parity check codes based on deliberate error insertion," Magnetics, IEEE Transactions on, vol. 40, No. 3, pp. 1738, 1743, May 2004.*

(Continued)

*Primary Examiner* — Cynthia Britt
(74) *Attorney, Agent, or Firm* — Volentine & Whitt, PLLC

(57) ABSTRACT

A data storage device includes a non-volatile memory device including a plurality of memory cells and a memory controller. The memory controller is configured to modify an arrangement of program data and to program the modified program data into the plurality of memory cells. The memory controller modifies the program data to eliminate a given data pattern causing physical interference between adjacent memory cells from the modified program data.

12 Claims, 19 Drawing Sheets

| Original Data | 0 | 1 | 0 | 1 | 1 | 0 | 1 | 0 | 1 | | | | |
|---|---|---|---|---|---|---|---|---|---|---|---|---|---|
| Original Pattern | P | E | P | E | E | P | E | P | E | | | | |
| (1,∞)RLL Code | 0 | 0 | 0 | 1 | 0 | 0 | 1 | 0 | 0 | 1 | 0 | 1 | 0 | 0 |
| NRZ-M(Line Code) | 0 | 0 | 0 | 1 | 1 | 1 | 0 | 0 | 0 | 1 | 1 | 0 | 0 | 0 |
| Modified Pattern(PEP X) | P | P | P | E | E | E | P | P | P | E | E | P | P | P | P |

(56) References Cited

U.S. PATENT DOCUMENTS

| | | | |
|---|---|---|---|
| 8,392,799 B1* | 3/2013 | Sutardja et al. | 714/763 |
| 2007/0083491 A1* | 4/2007 | Walmsley et al. | 707/3 |
| 2007/0245214 A1* | 10/2007 | Ramamoorthy | 714/758 |
| 2010/0239088 A1* | 9/2010 | Torbarac | 380/201 |
| 2010/0257429 A1* | 10/2010 | Noguchi | 714/763 |
| 2011/0083054 A1* | 4/2011 | Ozdemir et al. | 714/752 |
| 2011/0258509 A1* | 10/2011 | Ramamoorthy | 714/752 |
| 2012/0166912 A1* | 6/2012 | Kou | 714/758 |

OTHER PUBLICATIONS

Vasic, B.; Pedagani, K., "A runlength limited low-density parity-check coding scheme," Communications, 2003. ICC '03. IEEE International Conference on , vol. 5, no., pp. 3115,3119 vol. 5, May 11-15, 2003.*

Fragouli et al. "Turbo-Encoder Design for Symbol-Interleaved Parallel Concatenated Trellis-Coded Modulation" IEEE Transactions on Communications, vol. 49, No. 3, Mar. 2001.*

* cited by examiner

Fig. 5

$(d = 1, K = \infty)$

| Input Data | RLL Coded Data |
|---|---|
| 000 | 00000 |
| 001 | 00001 |
| 010 | 00010 |
| 011 | 00100 |
| 100 | 00101 |
| 101 | 01000 |
| 110 | 01001 |
| 111 | 01010 |

Fig. 6

| (2,∞)RLL Code | 1 | 0 | 0 | 1 | 0 | 0 | 1 | 0 | 0 | 1 | ... |
|---|---|---|---|---|---|---|---|---|---|---|---|
| RLL Coding Pattern | E | P | E | P | E | P | E | P | P | E | ... |
| Inverting | 0 | 1 | 0 | 1 | 0 | 1 | 0 | 1 | 1 | 0 | ... |
| Inverted Pattern | P | E | P | E | P | E | P | E | E | P | ... |

Fig. 8

| Original Data | 0 | 1 | 0 | 1 | 1 | 0 | 1 | 0 | 1 |
|---|---|---|---|---|---|---|---|---|---|
| Original Pattern | P | E | P | E | E | P | E | P | E |
| (1,∞)RLL Code | 0 | 0 | 1 | 0 | 1 | 0 | 1 | 0 | 0 |
| NRZ-M(Line Code) | 0 | 0 | 1 | 1 | 0 | 0 | 1 | 0 | 0 |
| Modified Pattern(PEP X) | P | P | E | E | P | P | E | P | P |

Fig. 12

| Original Data | 0 | 1 | 1 | 1 | 1 | 0 | 1 | 0 | 1 |
|---|---|---|---|---|---|---|---|---|---|
| Original Pattern | S | R | R | R | R | S | R | S | R |
| (1,∞)RLL Code | 0 | 1 | 0 | 0 | 1 | 0 | 1 | 0 | 0 |
| Modified Pattern | S | S | R | S | S | R | S | R | S | S | S | R | S | S | R | S | S | S | ing the modified program data according to a line code.

DATA STORAGE DEVICE AND PROGRAM METHOD THAT MODIFIES ARRANGEMENT OF PROGRAM DATA TO ELIMINATE INTERFERING DATA PATTERNS

CROSS-REFERENCE TO RELATED APPLICATIONS

A claim of priority under 35 U.S.C. §119 is made to Korean Patent Application No. 10-2010-0043613, filed on May 10, 2010, the entirety of which is incorporated herein by reference.

BACKGROUND

The present disclosure herein relates to a semiconductor memory device, and more particularly, to a data storage device, including a non-volatile memory device, and a program method thereof.

In general, semiconductor memory devices are classified as either volatile memory devices or non-volatile memory devices. While the read and write speed of volatile memory devices is relatively fast, they are generally characterized by the loss of stored information upon power-off. On the other hand, non-volatile semiconductor memory devices are generally characterized by the retention of stored data even if the power supply thereto is interrupted. Among non-volatile memory devices, flash memory is considered advantageous for use as a secondary memory device because of its relatively high density.

In recent years, multi-bit memory devices are becoming more common as demand for high-density memory devices increases. Multi-bit memory devices may store multiple bits on a single memory cell. In addition, the process refining technology to improve integration is being developed continuously. However, higher integration can result in interference between memory cells of non-volatile memory device. Such interference may include coupling, program and read disturbance, and channel-coupled disturbance, and can cause the threshold voltage distribution of memory cells is spread. In an effort to overcome this problem, a Charge Trap Flash (CTF) memory has been developed. However, even in the CTF memory, physical problems like lateral charge spreading can still exist.

The robust Error Correction Code (ECC) may be used in a further effort to reduce the adverse consequences of interference. However, a relatively high cost is required when adopting robust ECC.

SUMMARY

Embodiments of the inventive concept provides a data storage device which includes a non-volatile memory device including a plurality of memory cells and a memory controller. The memory controller is configured to modify an arrangement of program data and to program the modified program data into the plurality of memory cells. The memory controller modifies the arrangement of the program data to eliminate a given data pattern causing a physical interference between adjacent memory cells from the modified program data.

In other embodiments of the inventive concept, a program method of a data storage device includes encoding program data according to an ECC operation, modifying an arrangement of the encoded program data according to a RLL code operation to obtain modified program data, and inverting a bit value of the modified program data.

In yet further embodiments of the inventive concept, a program method of a data storage device includes encoding program data according to an ECC operation, modifying an arrangement of the encoded program data according to a RLL code operation to obtain modified program data, and encoding the modified program data according to a line code.

In even other embodiments, the program method further comprising: programming the line coded data to a non-volatile memory cell.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 5 is a table showing a brief example of Run-Length Limited code (RLL code);

FIG. 6 is a table showing an exemplary data processing procedure of the arrangement modifier 130 shown in FIG. 4;

FIG. 8 is a table showing an exemplary data processing procedure of the arrangement modifier 130' shown in FIG. 7;

FIG. 10 illustrates phase change memory cells which a technical feature of the inventive concept is applied to;

FIG. 12 is a table showing an exemplary data processing procedure of the RLL encoder/decoder 410;

DETAILED DESCRIPTION OF THE EMBODIMENTS

Exemplary embodiments of the inventive concept will be described below in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the figures, the dimensions of elements may be exaggerated for convenience of illustration.

Terms used in the following embodiments may be used in the context of generally known meanings in related technical fields. For example, the term "at least one" includes one or more in number, and may be used to describe an element that is one or more in number.

Figure 1:
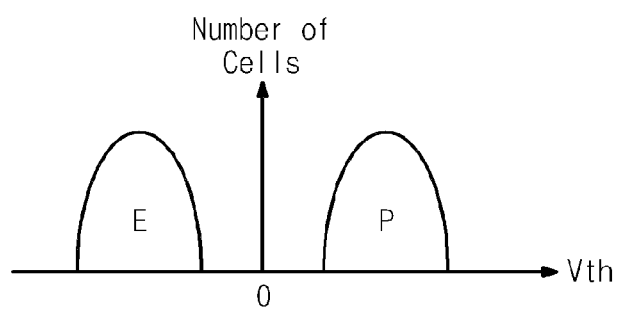
FIG. 1 is a graph showing a cell threshold voltage distribution of a flash memory device.

FIG. 1 is a graph showing a cell threshold voltage distribution of flash memory device. Referring to FIG. 1, a memory cell is programmed to erase state E or program state P. The erase state E may correspond to data '1'. The program state P may correspond to data '0'. The threshold voltage distribution of the erase state E may be lower than the threshold voltage distribution of the program state P. In a NAND type flash memory device, the threshold voltage of the erase state E may be negative. On the other hand, in a NOR type flash memory device, the threshold voltage of the erase state E may be positive.

Charge density of a floating gate of memory cell in the program state P is relatively higher than that of a floating gate of memory cell in the erase state E. Thus, adjacent memory cells having different states interfere with each other. Such interference may include disturbance, lateral charge spreading, coupling between memory cells, and so on.

The threshold voltage of a memory cell may increase or decrease under the influence of a threshold voltage of adjacent memory cell. In CTF memory, lateral charge spreading between a memory cell in the erase state E and a memory cell in the program state P is significant. In a floating-gate type flash memory device, program disturbance, read disturbance, and coupling between memory cells are significant.

In particular, increase in integration of memory device causes narrowing of a gap between memory cells, thus increasing the above-described interference. This requires a data processing technique for preventing the condition that memory cell in the erase state E and memory cell in the program state P are placed adjacent each other.

Figure 2:
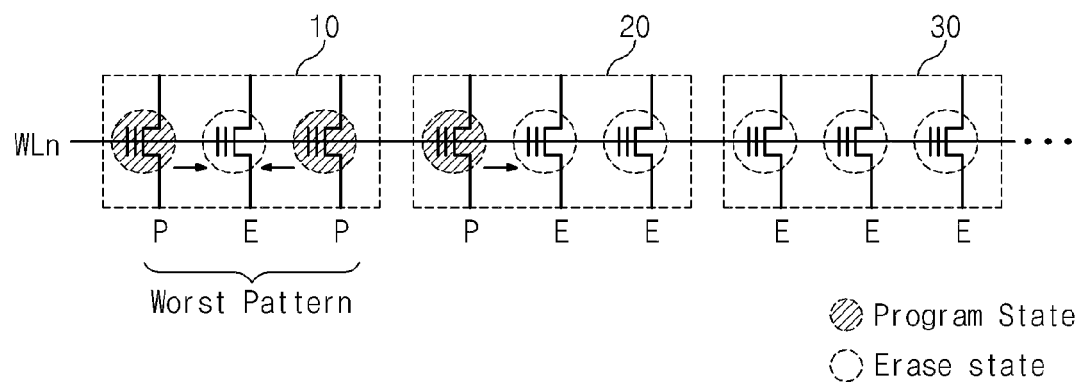
FIG. 2 illustrates exemplary patterns of data which are programmed in adjacent memory cells connected to the same word line.

FIG. 2 illustrates exemplary patterns of data which are programmed in adjacent memory cells connected to same word line. Referring to FIG. 2, patterns of data programmed in first to third groups of memory cells 10, 20, and 30 are shown as an example.

Memory cells in first group 10 store a data pattern of '010'. In other words, memory cells located on opposite sides among three memory cells in the first group 10 are in program state P, and the memory cell located on middle among three memory cells in the first group 10 is in erase state E. In this case, the middle memory cell in erase state E experiences interference from the memory cells in program state P. Thus, the data pattern (hereinafter, referred to as 'P-E-P') stored in memory cells of the first group 10 is deemed a worst data pattern.

On the other hand, memory cells in second group 20 store a data pattern of '100' and memory cells in third group 30 store a data pattern of '000'. Memory cells located at the middle of the second and third groups 20 and 30 undergo less interference than the middle memory cell located in the first group 10 (P-E-P).

Figure 3:
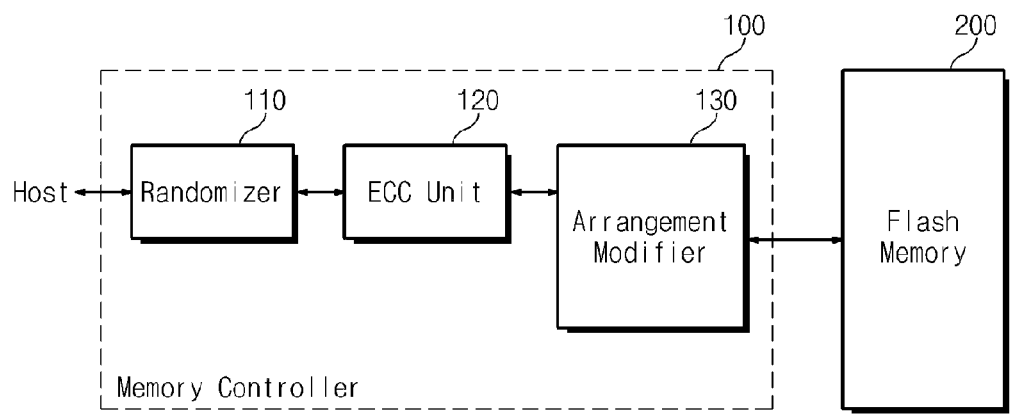
FIG. 3 is a block diagram showing a storage device according to a first embodiment of the inventive concept.

FIG. 3 is a block diagram showing a storage device according to a first embodiment of the inventive concept. Referring to FIG. 3, the storage device includes a memory controller 100 and a flash memory device 200.

The memory controller 100 accesses the flash memory device 200 in response to requests from an external source (for example, a host). If program data is provided from the host, the memory controller 100 performs data processing to enhance security and reliability. For example, the memory controller 100 performs a randomizing operation to the program data. Further, the memory controller 100 may perform an ECC operation to the program data. In addition, the memory controller 100 performs an arrangement modifying operation to prevent the above-described worst pattern P-E-P. For this operation, the memory controller 100 includes a randomizer 110, an ECC unit 120, and an arrangement modifier 130.

The randomizer 110 performs a randomizing operation for the program data. In addition, the randomizer 110 performs a de-randomizing operation so that read data from the flash memory device 200 may be restored to original data by a de-randomizing operation. The arrangement of the program data may be changed randomly by the randomizer 110 from the original data. Interferences between memory cells are made uniform when the randomized program data is stored in memory cells of the flash memory 200. In addition, data security may be enhanced by the randomizing operation.

In a program operation, the ECC unit 120 encodes the program data from the randomizer 110 according to an ECC operation. The ECC unit 120 classifies the program data to a codeword. The codeword is the smallest unit for error detection and error correction. The ECC unit 120 performs the error detection and the error correction for each codeword. The ECC unit 120 generates a parity corresponding to the program data according to the ECC operation.

On the other hand, the ECC unit 120 may detect and correct error in the read data. The ECC unit 120 may detect errors in user data by referring to the parity included in the read data. If an error exists in the user data, the ECC unit 120 calculates a location and value of the error and corrects the error. The error-corrected user data will be provided to the randomizer 110.

The arrangement modifier 130 modifies an arrangement of the program data. The arrangement modifier 130 modifies the arrangement of the program data such that a specific data pattern (for example, P-E-P) is not programmed to the flash memory device. In a read operation, the arrangement modifier 130 decodes the read data reversely relative to the program operation. The original arrangement may be restored from arrangement of the read data by the arrangement modifier 130. The arrangement modifier 130 may provide the restored original arrangement to the ECC unit 120.

The flash memory device 200 may be configured by a floating gate type or charge trap type. Each memory cell of the flash memory device 200 may be implemented by a single-leveled cell (SLC) or multi-leveled cell (MLC). The flash memory device 200 may be replaced by a variety of memory devices. The flash memory device 200 may be replaced by a resistance memory such as PRAM (Phase Change Random Access Memory) or RRAM (Resistance Random Access Memory).

In addition, the flash memory device 200 may be replaced by memory device using NFGM (Nano Floating Gate Memory), PoRAM (Polymer Random Access Memory), MRAM (Magnetic Random Access Memory) or FRAM (Ferroelectric Random Access Memory).

In the above-described first embodiment of the inventive concept, a specific pattern included in the program data may be eliminated by the arrangement modifier 130. It will be well understood that placement of the ECC unit 120 and the arrangement modifier 130 is not limited to the illustrated order. In other words, the placement of the ECC unit 120 and the arrangement modifier 130 may be varied. For example, if the ECC operation by the ECC unit 120 is a systemic ECC which does not change an arrangement of a message data, the arrangement modifier 130 may be placed in front of the ECC unit 120.

The arrangement modifier 130 may apply the above-described processing procedure to all data of a column which are entered for the program operation. However, modifying an arrangement of all program data may be unacceptably burdensome to the memory controller 100. Therefore, the arrangement modifier 130 may apply the above-described processing procedure to selected data is deemed to require high reliability.

Figure 4:
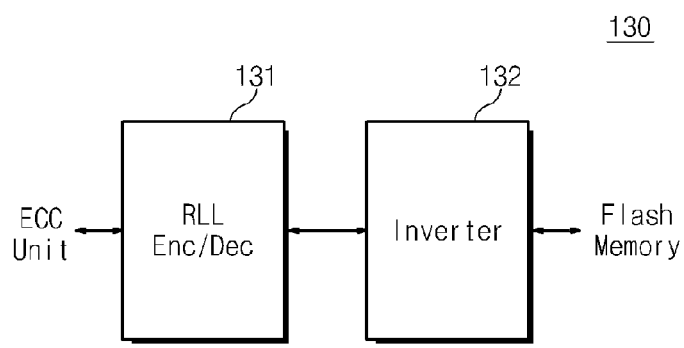
FIG. 4 is a block diagram showing an example of an arrangement modifier 130 shown in FIG. 3.

FIG. 4 is a block diagram showing an example of the arrangement modifier 130 shown in FIG. 3. Referring to FIG. 4, the arrangement modifier 130 includes an RLL encoder/decoder 131 and an inverter 132.

The RLL encoder/decoder 131 handles program data from the ECC unit 120 according to the RLL code method. The RLL encoder/decoder 131 encodes input data column to avoid continuous logical '1's. There is a (d, k) code as an example of binary RLL code. In the (d, k) code scheme, logical '0's of minimum 'd' to maximum 'k' may be included between two logical '1's. The 'd' indicates a minimum number of logical '0's placed between two logical '1's. The 'k' indicates a maximum number of logical '0's placed between two logical '1's. The RLL encoder/decoder 131 decodes the read data according to a procedure which is reversed relative to that of the program operation.

The inverter 132 inverts data encoded by the RLL encoder/decoder 131. According to an RLL encoding condition of (d=2, k=∞), two or more logical '0's exist between two logical '1's at all times. Thus, a '101' pattern may be prevented in the program data. If the inverter 132 is applied after the RLL encoding of condition (d=2, k=∞), the presence of the '010' pattern may be prevented. Thus, an occurrence may be prevented of a specific pattern (e.g., P-E-P) which should be avoided.

Program data inverted by the inverter 132 do not include data column of a specific pattern (e.g., P-E-P). Thus, interference between adjacent cells of the flash memory device 200 may be prevented. In a read operation, the RLL encoder/decoder 131 and the inverter 132 process read data according to procedure which is reversed relative to the program operation.

FIG. 5 is a table showing an example of Run-Length Limited code (RLL code) briefly. Referring to FIG. 5, a table defining an encoding condition of (d=1, k=∞) is shown as an example of binary RLL code which is configured to avoid contiguous logical '1's.

According to an encoding condition of (d=1, k=∞), logic '0' of one to infinity may be included between two logical '1's. According to this encoding condition, the RLL code of 3 bits input and 5 bits output may be configured as a look-up table shown in FIG. 5. If input data is '010', the RLL encoder/decoder 131 (also shown in FIG. 4) will output data '00010'. If input data is '111', the RLL encoder/decoder 131 (also shown in FIG. 4) will output data '01010'.

A decoding process according to the decoding condition of (d=1, k=∞) is performed according to a procedure which is reversed relative to the encoding process. The RLL encoder/decoder 131 may decode read data '01010' to data '111'. The RLL encoder/decoder 131 may decode read data '00001' to data '001'.

The RLL code encoding/decoding method is not limited to the illustrated look-up table method. For example, a binary RLL code may be implemented by algorithms designed in various ways.

FIG. 6 is a table showing an exemplary data processing procedure of the arrangement modifier 130 shown in FIG. 4. Referring to FIG. 6, a specific pattern P-E-P may occur in a data column configured by the RLL code. However, the specific pattern may be eliminated by an inverting operation. More details are as follows.

Let's assume that a data column encoded according to an encoding condition of (d=2, k=∞) is '10010001...'. First, an '101' pattern may be eliminated by the RLL code. If the inverter 132 is applied after the RLL encoding, the '010' pattern (P-E-P pattern) may be eliminated. If logical '1' indicates a program state and logical '0' indicates an erase state, a P-E-P pattern may be eliminated by using the RLL encoder/decoder 131 corresponding to a condition of (d=2, k=∞) without using the inverter 132.

Figure 7:
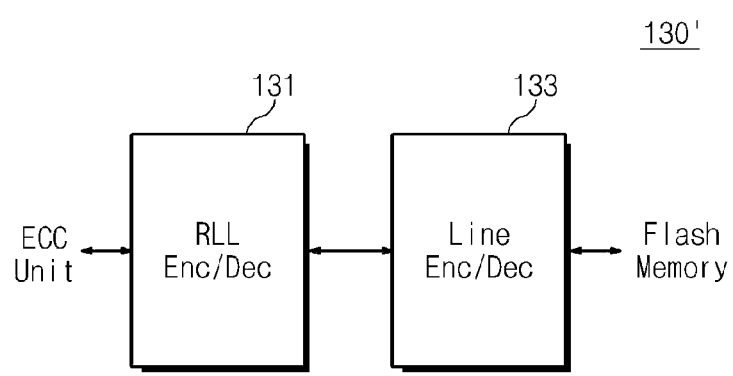
FIG. 7 is a block diagram showing another example of an arrangement modifier shown in FIG. 3.

FIG. 7 is a block diagram showing another example of an arrangement modifier shown in FIG. 3. Referring to FIG. 7, the arrangement modifier 130' includes a RLL encoder/decoder 131 and a line encoder/decoder 133. The RLL encoder/decoder 131 is substantially identical to the RLL encoder/decoder 131 shown in FIG. 4 described above. Thus, a detailed description for the RLL encoder/decoder 131 is omitted.

The line encoder/decoder 133 processes data column encoded by the RLL encoder/decoder 131 in a line code method. In general, the line code is a code format designed for a transmission line, and accordingly, a characteristic of the line code is a data arrangement which minimizes a DC component. During an encoding operation by the line code, it is determined whether a bit value of previous output data is maintained or inverted by referring to a bit value of input data. In the case of a differential encoding (NRZ-M), if an input bit is '0' then a bit value of previous output data is maintained, and if an input bit is '1' then a bit value of previous output data is inverted. If a line code is used, the line encoder/decoder 133 may eliminate a specific pattern P-E-P which is not eliminated by the RLL encoder/decoder 131.

The line code which may be applied to the line encoder/decoder (133) according to an embodiment of the inventive concept includes NRZ-M (NRZ-I), NRZ-S, NRZ-L, RZ, RZ-AMI, Bi-Φ-L (Bi-phase-L), Bi-Φ-M (Bi-phase-M), Bi-Φ-S (Bi-phase-S), delay modulation, dicode NRZ, dicode RZ and so on.

FIG. 8 is a table showing an exemplary data processing procedure of the arrangement modifier 130' shown in FIG. 7. Referring to FIG. 8, a specific data pattern P-E-P may exist in a data column which is input for a program operation. However, the specific data pattern P-E-P may be eliminated by the RLL code and the line code. More details are as follows.

Let's assume that original data provided from the ECC unit 120 is a 9 bit data column of '010|110|101'. Then, the original data corresponds to a data pattern 'PEP|EEP|EPE'. Therefore, if the original data is programmed without applying the arrangement modifier 130', interference between memory cells is inevitable.

If the original data of '010|110|101' is encoded by the RLL code according to an encoding condition of (d=1, k=∞), a data column of '00010|01001|01000' is output. This output data column may be obtained easily by the table shown in FIG. 5. However, a specific pattern P-E-P still exists in the data column.

The result of the RLL encoding becomes data column of '00011|10001|10000' by line code (NRZ-M) encoding. A pattern corresponding to a modified data column is "PPPEE|EPPPE|EPPPP'. Thus, a specific pattern P-E-P in data column may be eliminated by the line encoding.

FIG. 9A to FIG. 9M are block diagrams showing other examples of an arrangement modifier according to an embodiment of the inventive concept. For example, two regulators 130, 130' were shown in above-described FIG. 4 and FIG. 7. However, an arrangement modifier according to an embodiment of the inventive concept may be implemented with various layouts. In other words, the arrangement modifier 130 may be implemented with various combinations of the RLL encoder/decoder 131, the inverter 132 and the line encoder/decoder 133.

Figure 9A:
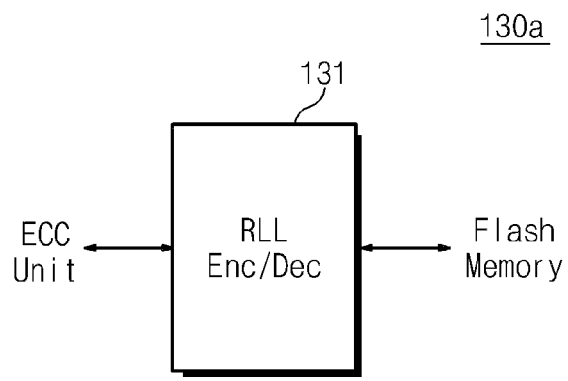
FIGS. 9A to 9M are block diagrams showing other examples of an arrangement modifier according to an embodiment of the inventive concept.
Figure 9B:
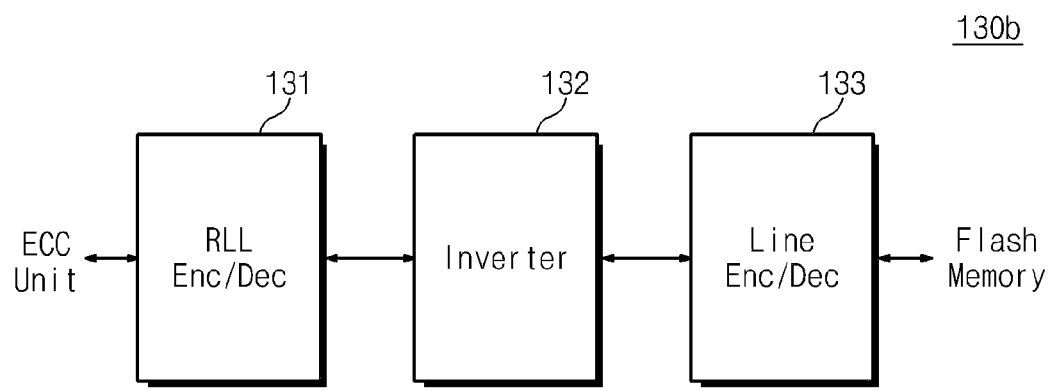
Figure 9C:
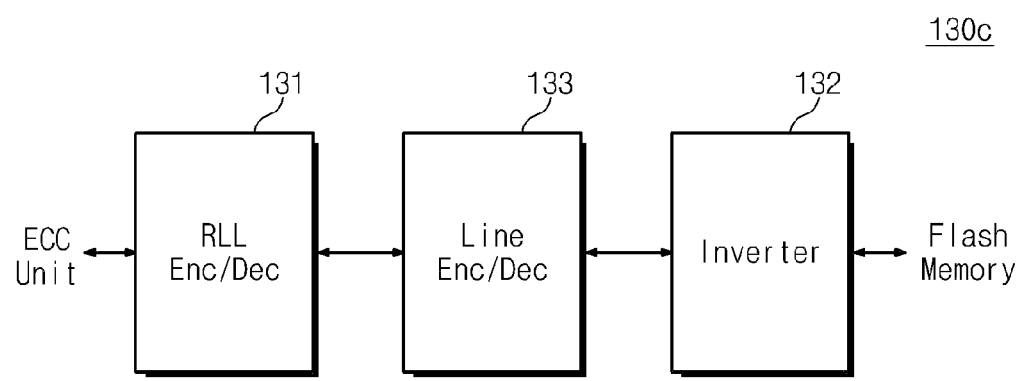

FIG. 9A is a block diagram showing an exemplary arrangement modifier 130a implemented with the RLL encoder/decoder 131. FIG. 9B and FIG. 9C show arrangement modifiers 130b, 130c implemented with various combinations of inverter 132 and the line encoder/decoder 133 on the condition that the RLL encoder/decoder 131 is foremost.

Figure 9D:
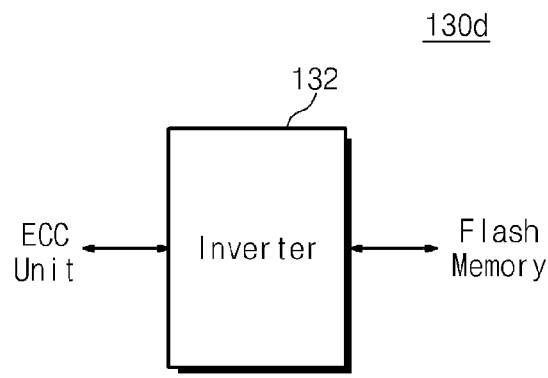
Figure 9E:
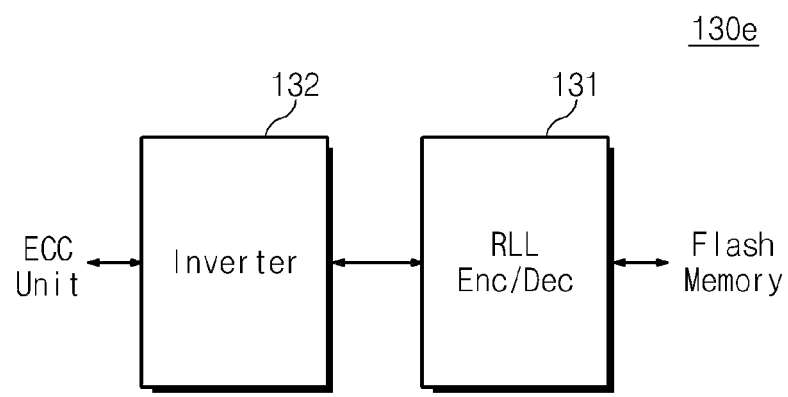
Figure 9F:
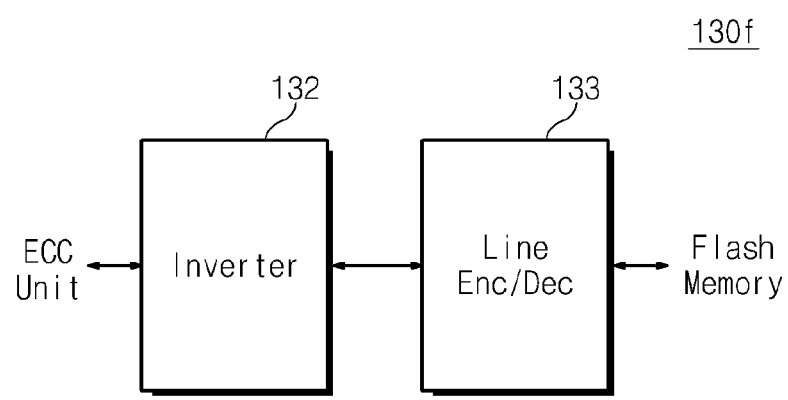
Figure 9G:
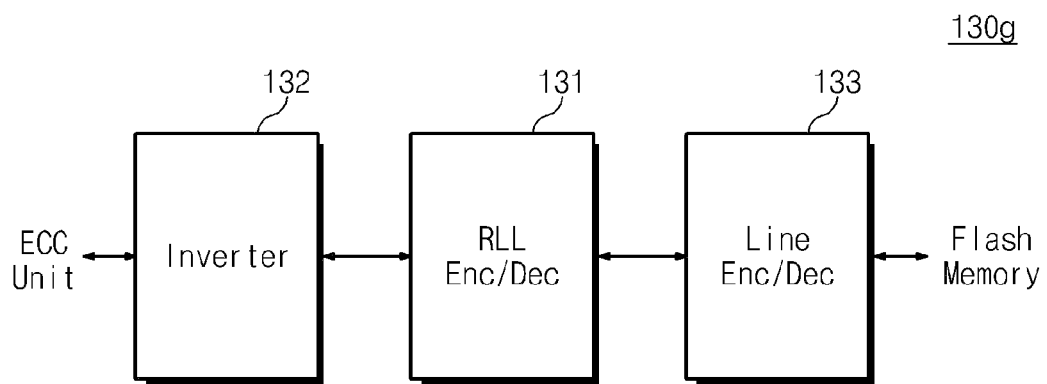
Figure 9H:
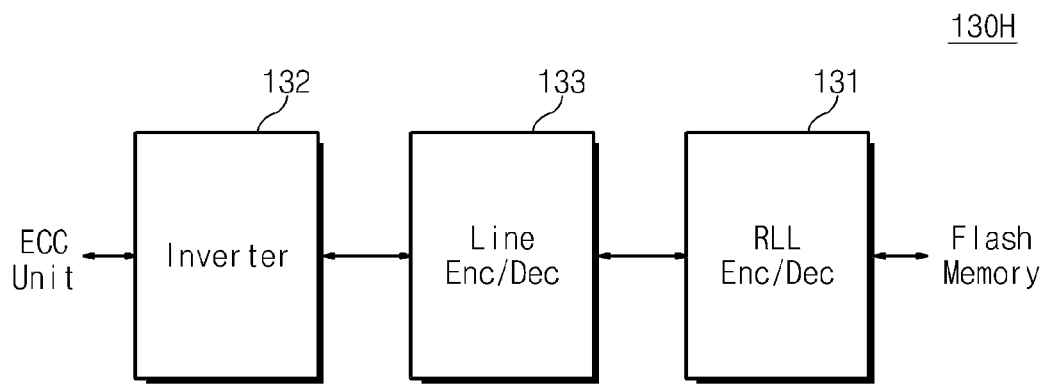

FIG. 9D is a block diagram showing an exemplary arrangement modifier 130d implemented with the inverter 132. FIG. 9E to FIG. 9H show arrangement modifiers 130e, 130f, 130g, and 130h implemented with various combinations of the RLL encoder/decoder 131 and the line encoder/decoder 133 on the condition that the inverter 132 is foremost.

Figure 9I:
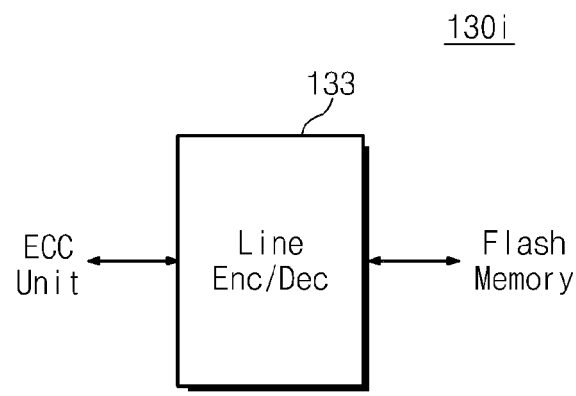
Figure 9J:
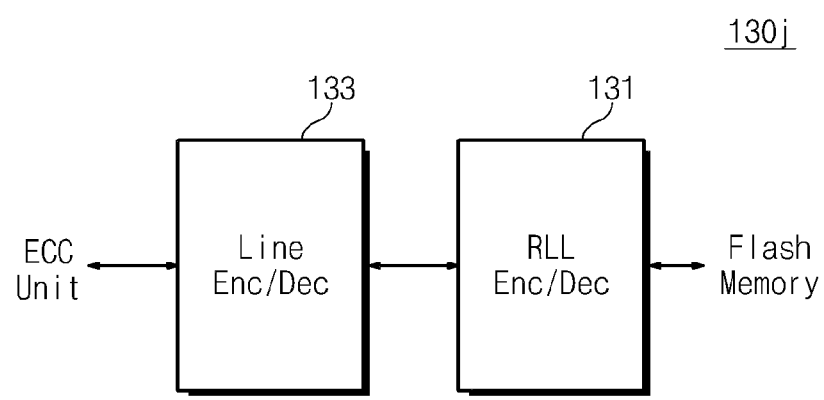
Figure 9K:
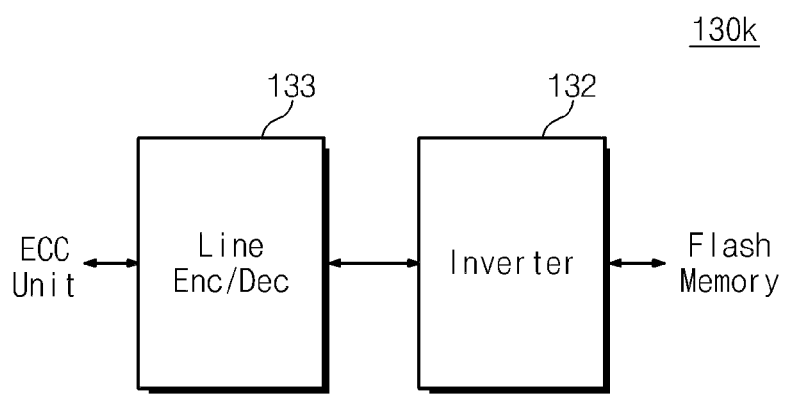
Figure 9L:
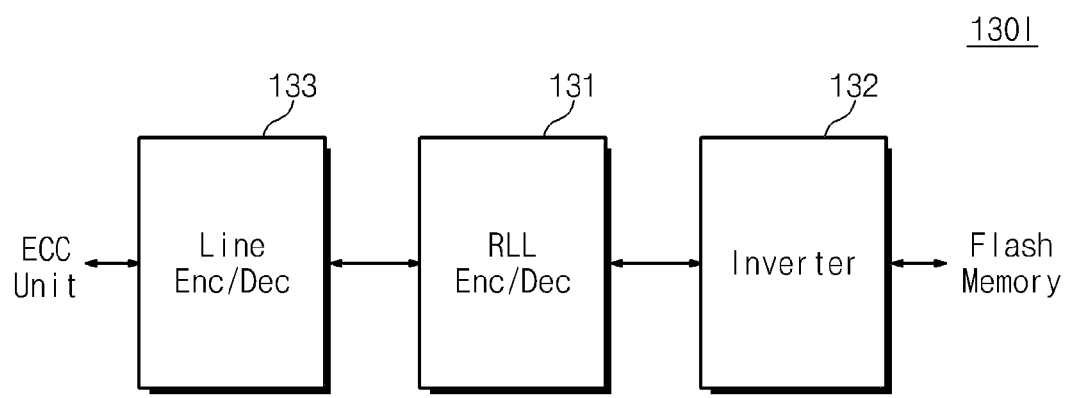
Figure 9M:
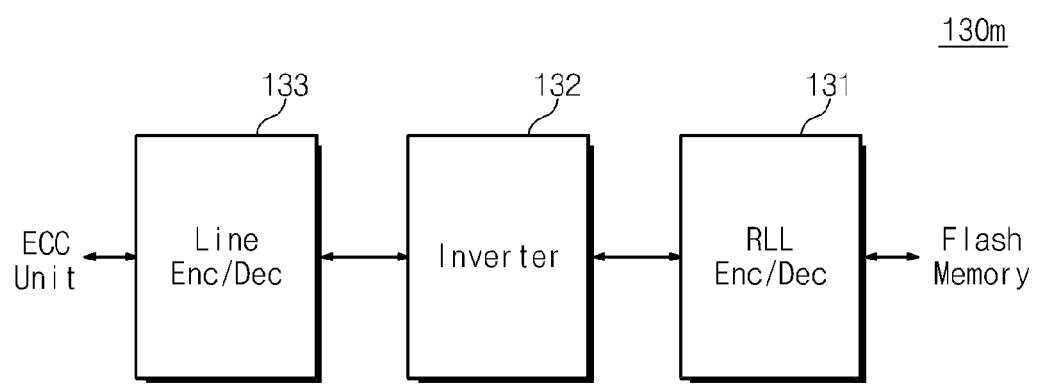

FIG. 9I is a block diagram showing an exemplary arrangement modifier 130i implemented with the line encoder/decoder 133. FIG. 9J to FIG. 9M show arrangement modifiers 130j, 130k, 130l, 130m implemented with various combinations of the RLL encoder/decoder 131 and the inverter 132 on the condition that the line encoder/decoder 133 is foremost.

In above examples, data pattern P-E-P was described as an example of a given data pattern which should be eliminated. However, it will be well-understood that the scope of the inventive concept is not limited to data pattern P-E-P. The given data pattern which should be eliminated may be changed for various applications and various purposes.

Figure 10:
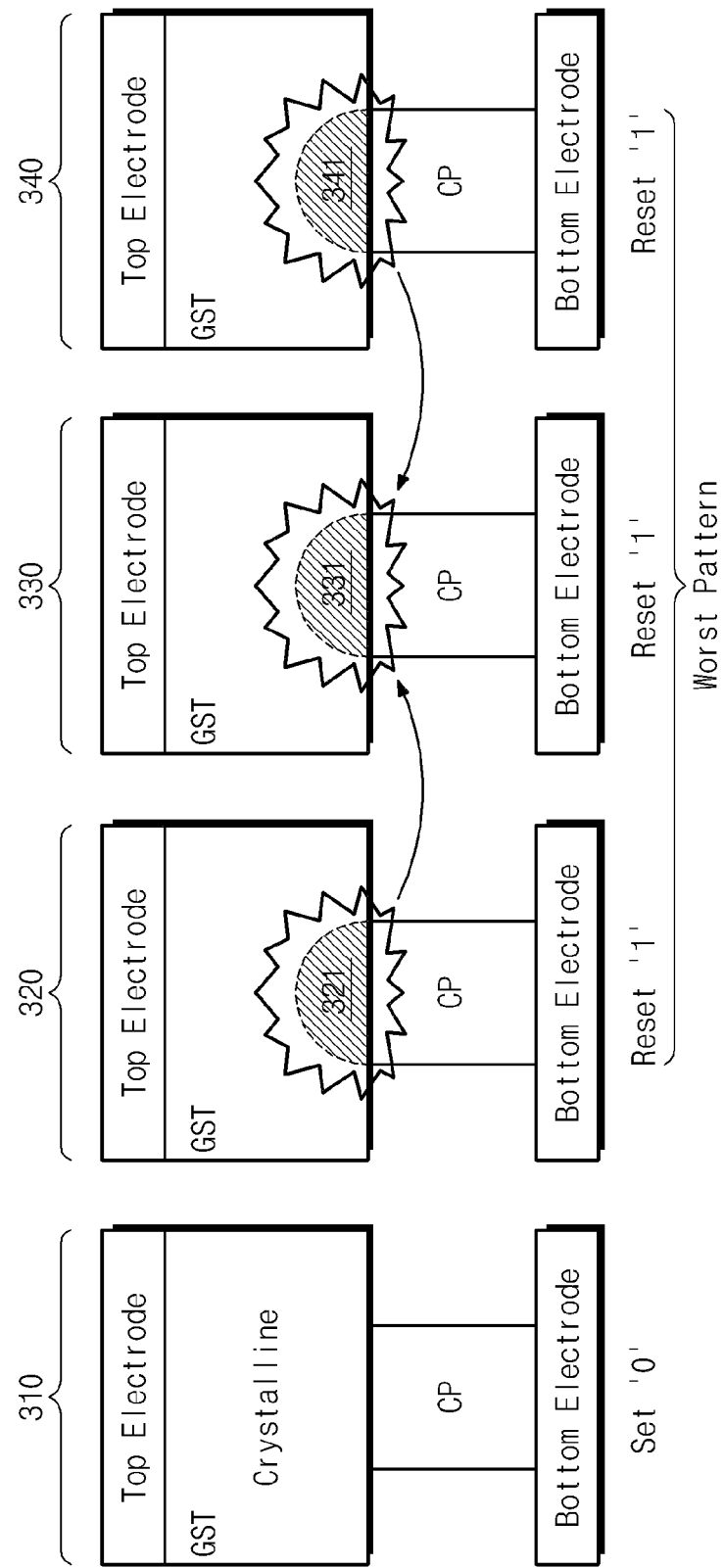

FIG. 10 illustrates phase change memory cells to which the technical feature of the inventive concept may also be applied. Referring to FIG. 10, variable resistors corresponding to each phase change memory cell 310, 320, 330 and 340 are shown in section.

Each phase change memory cell 310, 320, 330, and 340 includes a top electrode, a phase-changeable material GST, a contact plug CP, and a bottom electrode. Although not shown in FIG. 10, the top electrode is connected to a bit line BL. The bottom electrode is connected to the contact plug CP and an access device such as a transistor (not shown in FIG. 10). The contact plug CP is made from a conductive material (for example, TiN, etc.) and may be called a heater plug. The phase-changeable material GST is formed between the top electrode and the contact plug CP.

The phase-changeable material GST may turn to its amorphous state by heating the phase-changeable material GST to a temperature higher than its melting point using a controlled current and then quenching the temperature. The amorphous state, also known as the 'reset state', is used to store data '1' within the phase-changeable material GST. In contrast, the phase-changeable material GST may turn to its crystalline state by heating it up to a temperature higher than its crystallization temperature and lower than the melting temperature using a controlled current and then cooling phase-changeable material GST slowly. The crystalline state is called the 'set state' and is used for storing data '0'. The resistance of the memory cell depends on the amount of amorphous volume included in the phase-changeable material GST. Note that the resistance of memory cell is higher in the amorphous state than in the crystalline state.

To turn the phase-changeable material GST to reset state, the phase-changeable material GST needs to be heated to a temperature higher than its melting point and then quenched. However, when all adjacent phase change memory cells 320, 330, and 340 are programmed to reset state, rapid cooling is not easy. For example, when all phase change memory cells 320, 330, and 340 are programmed to the reset state, a cooling rate of the phase change memory cell 330 is reduced. In this case, a resistance of the phase change memory cell 330 may be smaller than a target resistance.

In phase change memory, the data pattern R-R-R may be the worst data pattern which should be eliminated. The data pattern R-R-R indicates that three or more consecutive adjacent memory cells are programmed to a reset state. As described below, inventive concept described above may be readily utilized to eliminate the data pattern R-R-R, for example, from the programmed phase change memory.

Figure 11:
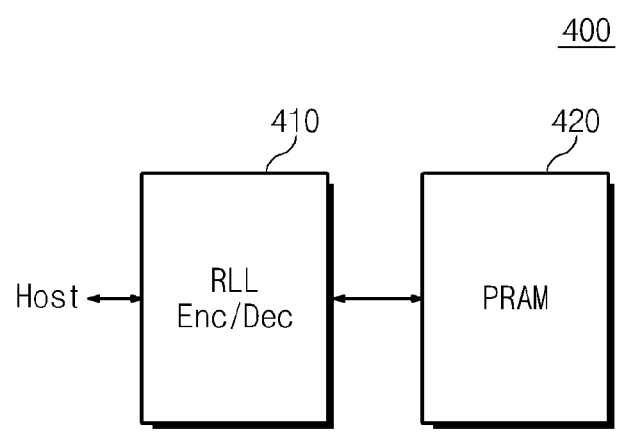
FIG. 11 is a block diagram showing a storage device according to second embodiment of the inventive concept.

FIG. 11 is a block diagram showing a storage device according to second embodiment of the inventive concept. Referring to FIG. 11, the storage device 400 includes a RLL encoder/decoder 410, and a PRAM 420.

The RLL encoder/decoder 410 accesses the PRAM 420 in response to request from a host. When the program data is provided from the host, the RLL encoder/decoder 410 performs an arrangement modifying operation for program data to prevent the worst pattern R-R-R. The RLL encoder/decoder 410 may perform the RLL code operation to prevent programming three or more consecutive reset data to a PRAM 420. For this operation, the RLL encoder/decoder 410 may perform an RLL code operation with various conditions.

The PRAM 420 has a program characteristic as described above in connection with FIG. 10. Therefore, if a specific data pattern R-R-R is included in the program data, the reliability of the data in the PRAM 420 will decrease. The specific data pattern R-R-R indicates that adjacent three memory cells are programmed to the reset state. In this case, the cooling rate of memory cell located in the middle may be reduced due to temperatures of adjacent memory cells. As a result, a phase-changeable material of the middle memory cell may not sufficiently turn to an amorphous state.

However, if the worst pattern R-R-R is eliminated by the RLL encoder/decoder 410, this program condition may be eliminated. In addition, even though only the RLL encoder/decoder 410 is shown in above-described FIG. 11, it will be well-understood that a randomizer for modifying a data arrangement and/or systematic or non-systemic ECC unit may be added.

FIG. 12 is a table showing an exemplary data processing procedure of the RLL encoder/decoder 410. Referring to FIG. 12, a specific pattern R-R-R may exist in an input data column for a program operation. However, a specific pattern R-R-R in the input data column for program operation may be eliminated by the RLL encoding.

Let's assume that the original data is 9-bit data column of '011|110|101'. The original data is provided to the RLL encoder/decoder 410 from a host for the program operation. The original data corresponds to the pattern of 'SRR|RRS|RSR'. Thus, if the original data is programmed without processing by the RLL encoder/decoder 410, interference between memory cells is inevitable because the original data includes a data pattern of 'R-R-R-R'. The data pattern of 'R-R-R-R' indicates four consecutive memory cells in reset state.

However, if an RLL encoding operation with an encoding condition of (d=1, k=∞) is performed to the original data of '011|110|101', a data column of '00100|01001|01000' will be output. The output of the data column may be obtained by the table of FIG. 5. The data pattern of 'R-R-R-R' does not exist in the data column encoded by the RLL encoder/decoder 410. The data pattern of 'R-R-R-R' may be completely eliminated by the RLL encoder/decoder 410 although number of data bits increase.

In the above examples, the data pattern of 'R-R-R' was described as an example of a data pattern which should be eliminated in phase change memory device. However, it will be well-understood that the scope of the inventive concept is not limited to this given data pattern. The given data pattern which should be eliminated may be changed for various applications and various purposes.

Figure 13:
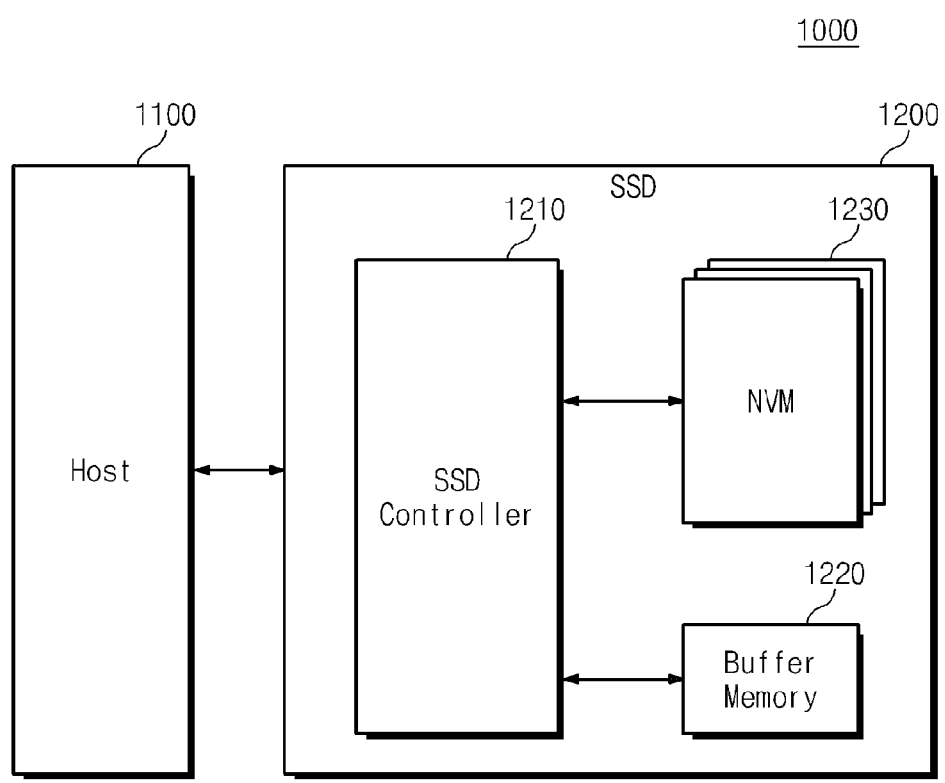
FIG. 13 is a block diagram showing a solid-state drive (SSD) system including a non-volatile memory device according to an embodiment of the inventive concept.

FIG. 13 is a block diagram showing a solid-state drive (SSD) system including a non-volatile memory device according to an embodiment of the inventive concept. Referring to FIG. 13, the SSD system 1000 includes a host 1100 and a SSD 1200. The SSD 1200 includes a SSD controller 1210, a buffer memory 1220, and a non-volatile memory device 1230.

The SSD controller 1210 connects the host 1100 and the SSD 1200 physically. In other words, the SSD controller 1210 provides interface with the SSD 1200 to the host 1100 in response to the bus format of the host 1100. In particular, the SSD controller 1210 decodes an instruction from the host 1100. According to the decoded result, the SSD controller 1210 accesses the non-volatile memory device 1230. The bus format of the host 1100 may include the USB (Universal Serial Bus), SCSI (Small Computer System Interface), PCI express, ATA, PATA (Parallel ATA), SATA (Serial ATA), and SAS (Serial Attached SCSI).

The SSD controller 1210 may include at least one of the randomizer 110, the ECC unit 120 and the arrangement modifier 130. The arrangement modifier 130 may be implemented by combinations of function and configuration in the same manner as with the RLL encoder/decoder 131, the inverter 132 and the line encoder/decoder 133.

Write data from the host 1100 or read data from the non-volatile memory device 1230 is temporarily stored in the buffer memory 1220. If data in the non-volatile memory device 1230 is stored in the buffer memory 1220, the buffer memory 1220 provides the cached data to the host 1100 directly in response to a read request from the host 1100. Typically, the bus format (for example, SATA or SAS) of the host 1100 is far faster than the speed of the memory channel of the SSD 1200. Thus, if the interface speed of the host 1100 is quite fast, a performance may be improved by providing the buffer memory 1220.

The buffer memory 1220 may be implemented by a synchronous DRAM. The synchronous DRAM is used for the SSD 1200 to provide sufficient buffering. The SSD 1200 is used as a secondary mass storage device. However, it is clear that the buffer memory 1220 is not limited to this embodiment to those who have acquired ordinary knowledge in this field.

The non-volatile memory device 1230 is provided as a storage media for the SSD 1200. For example, the non-volatile memory device 1230 may be implemented by a NAND-type flash memory having a large storage capacity. The non-volatile memory device 1230 may be implemented by multiple memory devices. In this case, each memory device is connected to the SSD controller 1210 through a channel. Although the NAND flash memory is described as a storage media, other non-volatile memory devices can be used. For example, PRAM, MRAM, ReRAM, FRAM, and NOR flash memory can be used as a storage media. In addition, a memory system using different types of memory devices also can be used. And as a storage media, a volatile memory device (for example, DRAM) may be used.

Figure 14:
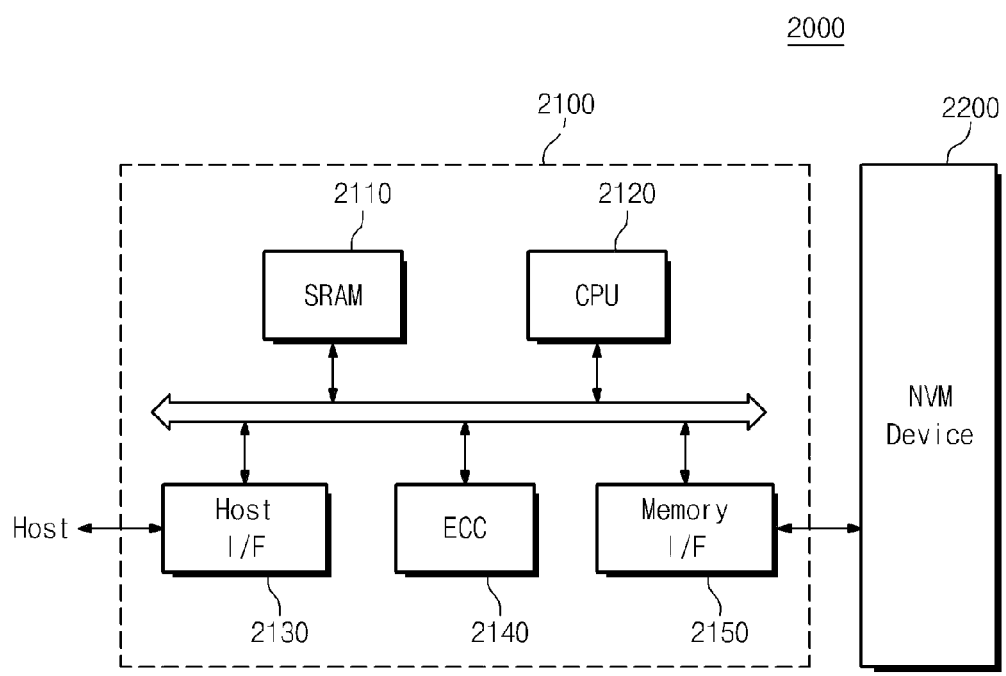
FIG. 14 is a block diagram showing a memory system according to exemplary embodiment of the inventive concept.

FIG. 14 is a block diagram showing a memory system according to exemplary embodiment of the inventive concept. Referring to FIG. 14, a memory system 2000 includes a non-volatile memory device 2200 and a memory controller 2100.

It is understood that the non-volatile memory device 2200 and the memory controller 2100 are configured to form a memory card or a Solid State Drive/Disk (SSD). A SRAM 2110 is used as a work buffer memory of a processing unit 2120. A host interface 2130 includes a protocol for exchanging data with a host connected to the memory system 2000. An ECC block 2140 is configured to detect and correct errors of data read out from the non-volatile memory device 2200. A priori probability computation unit, a posteriori probability computation unit, and a soft-decision decoder may be included in the ECC block 2140. A memory interface 2150 is configured to interface with the non-volatile memory device 2200. The processing unit 2120 is configured to control an overall operation (e.g., data exchange) of the memory controller 2100. Although not shown in FIG. 14, the memory system 2000 according to exemplary embodiments of the inventive concept may further comprise a ROM which stores code data for interfacing with the host.

Furthermore, the memory controller 2100 may include at least one of the randomizer 110 and the arrangement modifier 130 shown in FIG. 3. An arrangement modifier 130 may be configured by combination of function and configuration in the same manner as with the RLL encoder/decoder 131, the inverter 132 and line encoder/decoder 133.

The non-volatile memory device 2200 may be formed of a multi-chip package having a plurality of flash memory chips. In particular, a flash memory device according to exemplary embodiments of the inventive concept is able to be applied to a memory system such as an SSD. In this case, the memory controller 2100 may be configured to communicate with an external (for example, a host) via one of various interface protocols such as USB, MMC, PCI-E, SATA, PATA, SCSI, ESDI, IDE, and the like. In addition, the memory controller 2100 may include additional configurations to perform a random operation.

Figure 15:
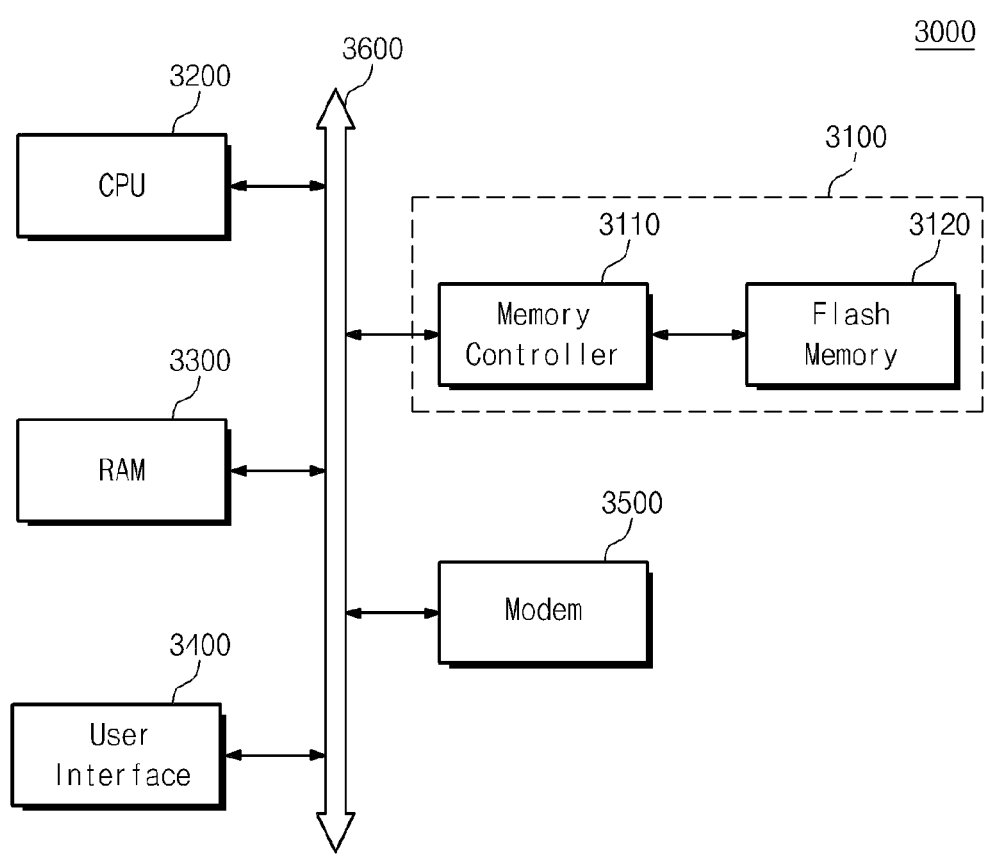
FIG. 15 is a block diagram showing a computing system 3000 including a non-volatile memory device 3120 according to exemplary embodiments of the inventive concept.

FIG. 15 is a block diagram showing a computing system 3000 including a non-volatile memory device 3120 according to exemplary embodiments of the inventive concept. Referring to FIG. 15, a computing system 3000 includes a processing unit 3200 such as a microprocessor or a CPU, a RAM 3300, a user interface 3400, a modem such as a baseband chipset, and a memory system 3100 which are electrically connected to a system bus 3600. The memory system 3100 may be configured substantially identically to that illustrated in FIG. 13 or FIG. 14. In the event that the computing system 3000 is a mobile device, a battery (not shown) may be further provided to supply an operating voltage of the computing system 3000. Although not shown in FIG. 15, it is understood that the computing system 3000 further comprises an application chipset, a camera image sensor (CIS), a mobile DRAM, and the like. The memory system 3100 may be formed of, for example, a Solid State Drive/Disk (SSD) which uses non-volatile memories to store data. Further, the memory system 3100 may be formed of a fusion flash memory (for example, a One-NAND flash memory).

The memory controller 3110 may include at least one of the randomizer 110, the ECC unit 120 and the arrangement modifier 130 shown in FIG. 3. The arrangement modifier 130 may be configured by combinations of function and configuration in the same manner as with the RLL encoder/decoder 131, the inverter 132 and line encoder/decoder 133.

A non-volatile memory device and/or a memory controller according to exemplary embodiments of the inventive concept may be packed by various types of packages. For example, the flash memory device and/or the memory controller may be packed by one selected from a group of PoP (Package on Package), Ball grid arrays(BGAs), Chip scale packages(CSPs), Plastic Leaded Chip Carrier(PLCC), Plastic Dual In-Line Package(PDIP), Die in Waffle Pack, Die in Wafer Form, Chip On Board(COB), Ceramic Dual In-Line Package(CERDIP), Plastic Metric Quad Flat Pack(MQFP), Thin Quad Flatpack(TQFP), Small Outline(SOIC), Shrink Small Outline Package(SSOP), Thin Small Outline(TSOP), Thin Quad Flatpack(TQFP), System In Package(SIP), Multi Chip Package(MCP), Wafer-level Fabricated Package(WFP), Wafer-Level Processed Stack Package(WSP), and the like.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A data storage device comprising:
a non-volatile memory device including a plurality of memory cells; and
a memory controller configure to modify an arrangement of program data and to program the modified program data into the plurality of memory cells,
wherein the memory controller modifies the arrangement of the program data to eliminate a given data pattern causing a physical interference between adjacent memory cells from the modified program data,
wherein the memory controller includes an arrangement modifier which performs an arrangement modifying operation to eliminate the given data pattern from the modified program data,
wherein the arrangement modifier includes an RLL (Run-Length Limited) code unit which encodes the program data, and
wherein the RLL code unit encodes the program data with an encoding condition of (d=2, k=∞), where d is an integer denoting a maximum number of logical '0's between two logical '1's in the encoded program data, and k is an integer denoting a maximum number of logical '1's between logical '0's in the encoded program data.

2. The data storage device of claim 1, wherein the arrangement modifier further includes an inverter which inverts an output of the RLL code unit and provides the inverted output to the non-volatile memory device.

3. The data storage device of claim 1, wherein the memory controller includes an ECC (Error Correction Code) unit which processes data from a host according to an ECC operation and provides the processed data as the program data.

4. The data storage device of claim 1, wherein the memory controller includes an ECC (Error Correction Code) unit which processes an output of the arrangement modifier according to a systematic ECC which preserves an arrangement of bits and provides the processed output to the non-volatile memory device.

5. The data storage device of claim 1, wherein the memory controller includes a randomizer which randomizes data provided from a host.

6. The data storage device of claim 1, wherein the plurality of memory cells is implemented with flash memory cells and the given data pattern includes a data pattern of '010' or a data pattern of '101'.

7. The data storage device of claim 1, wherein the plurality of memory cells are implemented as single level cell (SLC) memory cells.

8. A data storage device comprising:
a non-volatile memory device including a plurality of memory cells; and
a memory controller configure to modify an arrangement of program data and to program the modified program data into the plurality of memory cells,
wherein the memory controller modifies the arrangement of the program data to eliminate a given data pattern causing a physical interference between adjacent memory cells from the modified program data,
wherein the memory controller includes an arrangement modifier which performs an arrangement modifying operation to eliminate the given data pattern from the modified program data, the arrangement modifier includes
a RLL (Run-Length-Limited) code unit configured to encode the program data, and
a line code unit configured to encode an output of the RLL code unit to a line code and to provide the line code to the non-volatile memory device,
wherein the RLL code unit encodes the program data with an encoding condition of (d=1, k=∞), where d is an integer denoting a maximum number of logical '0's between two logical '1's in the encoded program data, and k is an integer denoting a maximum number of logical '1's between logical '0's in the encoded program data.

9. The data storage device of claim 8, wherein the line code unit encodes according to an differential code or an NRZ-M (Non Return to Zero-Mark) method which maintains a previous output when an output of the RLL code unit is '1' and inverts the previous output when the output of the RLL code unit is '0'.

10. A data storage device comprising:
a non-volatile memory device including a plurality of memory cells; and
a memory controller configure to modify an arrangement of program data and to program the modified program data into the plurality of memory cells,
wherein the memory controller modifies the arrangement of the program data to eliminate a given data pattern causing a physical interference between adjacent memory cells from the modified program data, and
wherein the plurality of memory cells is implemented with a plurality of phase change memory cells and the given data pattern corresponds to at least one of a data pattern of '111', a data pattern of '000', and a data pattern corresponding to three adjacent memory cells which are programmed to a reset state.

11. A program method of a data storage device, comprising:
randomizing program data;
encoding the randomized program data according to an ECC (Error Correction Code) operation;
modifying an arrangement of the encoded program data according to a RLL (Run-Length-Limited) code operation to obtain modified program data;
inverting a bit value of the modified program data to obtain inverted program data; and
employing a memory controller to program the inverted program data into a non-volatile memory cell of the data storage device.

12. A program method of a data storage device, comprising:
randomizing program data;
encoding the randomized program data according to an ECC (Error Correction Code) operation;

modifying an arrangement of the encoded program data according to a RLL (Run-Length-Limited) code operation to obtain modified encoded program data;

encoding the modified encoded program data according to a line code to obtain line coded data;

inverting a bit value of the line coded data to obtain inverted line coded data; and employing a memory controller to program the inverted line coded data into a non-volatile memory cell of the data storage device.

* * * * *